United States Patent [19]

Piccone et al.

[11] 3,836,994

[45]*Sept. 17, 1974

[54] THYRISTOR OVERVOLTAGE PROTECTIVE ELEMENT

[75] Inventors: Dante E. Piccone, Philadelphia; Istvan Somos; James E. McIntyre, both of Lansdowne, all of Pa.

[73] Assignee: General Electric Company, Philadelphia, Pa.

[ * ] Notice: The portion of the term of this patent subsequent to Nov. 23, 1988, has been disclaimed.

[22] Filed: July 5, 1973

[21] Appl. No.: 376,766

Related U.S. Application Data

[60] Continuation of Ser. No. 198,798, Nov. 15, 1971, abandoned, which is a division of Ser. No. 88,853, Nov. 12, 1970, , which is a continuation-in-part of Ser. No. 820,959, May 1, 1969, Pat. No. 3,662,845.

[52] U.S. Cl. ........................ 357/38, 357/52, 357/86

[51] Int. Cl. ............................................. H01l 9/12

[58] Field of Search ................ 317/235 AA, 235 AB

[56] References Cited

UNITED STATES PATENTS

| | | | |
|---|---|---|---|
| 3,440,501 | 4/1969 | Piccone et al. | 317/235 AB |
| 3,622,845 | 11/1971 | McIntyre et al. | 317/235 AB |

OTHER PUBLICATIONS

Somos et al., "Behavior of Thyristors...," Proc. IEEE, Vol. 55, No. 8, Aug. 1967, pp. 1306–1311.

*Primary Examiner*—Rudolph V. Rolinec
*Assistant Examiner*—William D. Larkins
*Attorney, Agent, or Firm*—J. Wesley Haubner; Albert S. Richardson, Jr.

[57] ABSTRACT

A PNPN semiconductor element comprises an improved double-triggering device wherein two concentric electrode-less auxiliary regions are provided in one end layer, the two regions being so constructed and arranged that the outboard one has an underpass effect and the other one does not.

7 Claims, 6 Drawing Figures

PATENTED SEP 17 1974 3,836,994

THYRISTOR OVERVOLTAGE PROTECTIVE ELEMENT

This is a continuation of application Ser. No. 198,798, filed Nov. 15, 1971, now abandoned, which application was a division of application Ser. No. 88,853, filed on Nov. 12, 1970, now U.S. Pat. No. 3,662,250 for an improved Thyristor Overvoltage Protective Circuit; certain features of the semiconductor element claimed in the present application were described in a patent application Ser. No. 820,959 previously filed in the United States on May 1, 1969, and assigned to the General Electric Company (now U.S. Pat. No. 3,622,845 granted on Nov. 23, 1971), and as to any subject matter of the present application that is common to the prior application Ser. No. 820,959 the benefit of the filing date of said prior application is herein claimed. The application Ser. No. 198,798 was similarly entitled to the benefit of the filing date of said prior application.

In the above-cited parent application there is described and claimed an improved protective circuit for triggering a relatively high-current, high-voltage solid-state controlled switching device when a forward bias voltage of appreciable magnitude is impressed on the device. The device protected in the preferred embodiment of that circuit actually comprises an array of parallel "thyristors."

Thyristor is a generic name for a family of solid-state bistable switches, including silicon controlled rectifiers (SCR's), which are physically characterized by a body of monocrystalline semiconductor material between a pair of main current-carrying metallic electrodes (often designated the anode and the cathode, respectively). The semiconductor body may comprise, for example, a thin, broad area disc-like wafer having four layers of alternately P and N type conductivities, whereby three back-to-back PN (rectifying) junctions are formed between the main electrodes. Usually the wafer is mechanically sealed in an insulating housing and is electrically connected in an external power circuit by way of its anode and cathode. Suitable gating means is provided for initiating conduction between these main electrodes on receipt of a predetermined control or trigger signal.

When connected in series with a load impedance and subjected to a forward bias voltage (anode potential positive with respect to cathode), a thyristor will ordinarily block the flow of load current until triggered or "fired" by the application to its gate of a control signal above a small threshold value, whereupon it abruptly switches from a high resistance to a very low-resistance, forward conducting (on) state. Subsequently the device reverts to its nonconducting (turned off) state in response to through current being reduced below a given holding level. Hereinafter, the main current flowing through the thyristor between its anode and its cathode will be referred to as the anode current ($i$), and the potential difference between the anode and the cathode will be referred to as the anode voltage ($v$).

The forward current and peak blocking voltage ratings of a thyristor are specified by the manufacturer. These ratings determine, under stated conditions and without damaging the thyristor, the maximum load current that the thyristor can conduct when on and the maximum applied voltage that it can safely withstand when off. High-current ratings are generally obtained by using relatively large area semiconductor wafers, while high-voltage ratings require relatively thick base layers in the wafers. Thus, by way of example, a thyristor having a maximum continuous RMS forward current rating of 500 amperes and a repetitive peak forward blocking voltage rating of 2,600 volts at an operating junction temperature of 100°C. may have a wafer whose area is approximately 1 square inch and whose thickness is approximately 0.02 inch.

The above-mentioned ratings and dimensions exemplify individual high-power thyristors that are commercially available today. Such ratings are still much lower than required for very high-power switching applications. One such application is in the field of high-voltage direct-current power transmission where a plurality of controllable electric valves are interconnected and arranged to form a high-current converter for controlling the flow of bulk electric power between d-c and a-c sections of a high-voltage power transmission system. As much as 2,000 amperes may be carried by each converter valve in its on state, and well over 20,000 volts may be applied across the valve when off. To make a solid-state valve of this size, a plurality of arrays of parallel thyristors must be interconnected in series and operated in unison.

During those cyclically recurring intervals when the above-mentioned converter valve is in an off or blocking state, the valve and its associated equipment are prone to being damaged by extra high voltage surges that may be produced by a variety of different transient phenomena. To solve this problem, it is desirable to provide each level of thyristors in the valve with suitable means for applying a firing signal to the gates of the associated thyristors as soon as a surge of forward anode voltage is sensed, thereby turning on the valve itself before that voltage attains a destructively high magnitude. An improved overvoltage triggering scheme for this purpose is the subject matter of the parent application Ser. No. 88,853. Its construction, operation, and advantages are fully explained in that specification (which is incorporated herein by reference). As is there explained, the overvoltage triggering circuit includes overvoltage sensing means which in its preferred form comprises at least one PNPN semiconductor element that is intended to turn on in a voltage breakover mode.

A PNPN semiconductor element or thyristor can be turned on or triggered due to voltage breakover by allowing its anode voltage to increase to a critical level above rated peak forward blocking voltage. This mode of turn-on, which can be caused by an avalanche breakdown, a punch through, or excessive leakage, is a known phenomenon in the thyristor art. It is also known that the normal *di/dt* capabilities of conventional high-voltage thyristors (e.g., thyristors having peak blocking voltages over 1,500 volts) are seriously degraded when turned on in this mode.

The *di/dt* capability of a thyristor refers to the maximum initial rate of rise of forward anode current (inrush current slope) that the thyristor can tolerate without permanent damage when switching from blocking to fully conducting states. The maximum allowable di/dt during a single voltage breakover transient, and also during 60 Hz voltage breakover operation of the thyristor, is determined by the local temperature rise of the initially turned on area of the semiconductor wafer.

In the event of a voltage breakover, conduction begins in a relatively small area of the thyristor, and the applied voltage is very high. When the breakover action commences, the voltage across the thyristor is equal to the breakover level, whereupon it will decrease in a short time (e.g., 1 microsecond) to a value of the order of 50 to 100 volts and then more gradually, as the conducting area progressively spreads over the whole semiconductor wafer, to a lower steady-state forward anode voltage drop. Such high initial voltages result in a high instantaneous *vi* heat dissipation and high local temperature rise. To keep this heat dissipation from exceeding a permissible limit, the anode current must be limited to relatively low values during the turn on action, i.e., the initial *di/dt* must be low. To some degree this problem can be alleviated by using an improved thyristor such as is disclosed and claimed in U.S. Pat. No. 3,408,545–DeCecco et al. A general objective of the present invention is to provide, for use in a thyristor overvoltage protective circuit, an improved overvoltage triggered PNPN semiconductor element whose voltage breakover characteristics are optimized.

In carrying out our invention in one form, the PNPN semiconductor element comprises a four-layer silicon body, a main current-carrying contact, and means for connecting the contact to a predetermined end layer of the body. That end layer comprises a central main region and two auxiliary regions. The main region is joined to the contact, the first auxiliary region is disposed adjacent to the lateral border of the main region, and the other auxiliary region is disposed outboard with respect to the first auxiliary region. An electroconductive ring is connected to the first auxiliary region and spaced from the contact. The lateral resistance of the other auxiliary region is appreciably higher than the resistance between the ring and the contact. This structure is so arranged that, when the silicon body is subjected to an overvoltage condition, leakage current triggers a peripheral area thereof.

Our invention will be better understood and its various objects and advantages will be more fully appreciated from the following description taken in conjunction with the accompanying drawing in which.

Figure 1:
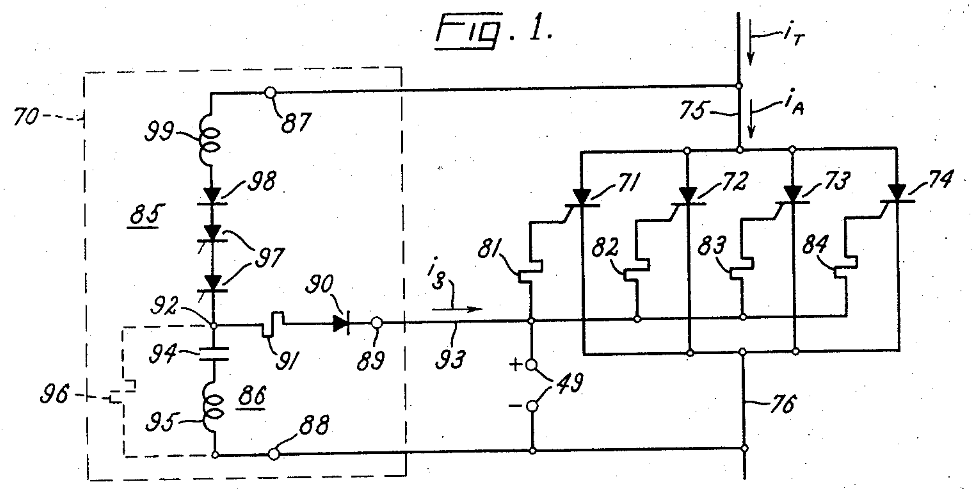
FIG. 1 is a schematic diagram of an array of parallel thyristors protected from overvoltage by a circuit that includes a pair of PNPN semiconductor elements embodying our invention.

FIG. 1 illustrates a switching matrix comprising four individual main thyristors 71, 72, 73, and 74 whose corresponding main electrodes are directly interconnected to form a parallel array of similarly poled devices. Each of these main thyristors is a high-power device having relatively large dimensions. By way of example, each thyristor may have a cylindrical insulating housing whose outside diameter is approximately 2 inches and whose axial dimension is approximately 1 inch. All four thyristors 71–74 can be physically disposed in a single pressure assembly with their respective anodes and cathodes clamped firmly between massive metal members which serve as electrical and thermal conductors, shown schematically at 75 and 76 in FIG. 1. The conductor 75 represents a common heat sink adjoining the anodes of these devices, and the conductor 76 represents another common heat sink adjoining the cathodes. By means of these conductors, the main electrodes of each thyristor are adapted to be connected in an electric power circuit such as that of the high-voltage valve previously described, and when so connected each thyristor is periodically subjected to a forward bias voltage.

Each of the main thyristors 71–74 is equipped with gating means for turning on the thyristor when energized by a compatible control signal in the presence of forward bias on the main electrodes. Although it could take other forms which are known in the art, the gating means that has been shown symbolically in FIG. 1, for purposes of illustration, is a control electrode responsive to a gating current pulse of suitable polarity, magnitude, and duration. The control electrodes of all four thyristors 71–74 are conductively coupled, via equalizing resistors 81, 82, 83, and 84, respectively, to the associated set of control terminals 49 which are periodically supplied with a trigger signal from an external gate drive circuit. Thus the respective gate electrodes are arranged to share the same trigger signal. In this manner each of the thyristors 71–74 is cyclically triggered, in unison with the other thyristors in the same array, from a high-resistance (off) state to its low-resistance (on) state to control the commencement of forward current conduction between the conductors 75 and 76 as desired. The resistance values of the respective resistors 81–84 are selected to help equalize the turn-on times of the four thyristors when forward biased by relatively low anode voltage. In FIG. 1 the total anode current flowing through the array when the thyristors are on is designated $i_A$.

As has been explained hereinbefore, the thyristors 71–74 are subject to being turned on without a trigger signal being applied to their gate electrodes whenever the instantaneous magnitude of their forward bias voltage increases to a level sufficiently above a normally applied peak forward blocking voltage to cause a voltage breakover. Thus a high-voltage thyristor having a rated peak forward blocking voltage of 2,600 volts might experience a voltage breakover if its anode voltage is allowed to attain a level of approximately 3,000 volts. This mode of turn-on is undesirable because it exposes the thyristor to serious damage if the initial *di/dt* is high. Furthermore, if a first one of the parallel thyristors 71–74 safely survives such turn on, it could be subsequently damaged by excessively high current if the companion thyristors, because of the collapse of anode voltage when the first one turned on, never breakover and consequently fail to conduct their share of $i_A$. The danger of a voltage breakover is avoided by using the improved overvoltage triggering scheme which is illustrated in FIG. 1 and will next be described.

As is shown in FIG. 1, the overvoltage triggering circuit 70 of our invention comprises overvoltage sensing means 85 connected in series with energy storing means 86 between first and second terminals 87 and 88. The first termianl 87 is connected to the anode conductor 75 of the main thyristors 71–74, and the second terminal 88 is connected to the cathode conductor 76, whereby the serial combination of the overvoltage sensing means 85 and the energy storing means 86 is disposed in parallel circuit relationship with the parallel array of main thyristors. The triggering circuit 70 also has a third terminal 89 which is connected by way of an isolating diode 90 and a resistor 91 to the juncture 92 of its two parts 85 and 86. The gate electrodes of the main thyristors 71–74 are all coupled to the terminal 89 by means of a conductor 93.

In normal operation the overvoltage sensing means 85 is intended to be in a very high-resistance state, and the voltage impressed across it will therefore be substantially the same as whatever voltage is applied to the main thyristors 71–74. However, if and when its voltage increases to a value indicating that the forward bias voltage on the parallel thyristors has attained a threshold magnitude which is higher than the normally applied peak forward blocking voltage but lower than the breakover level of the main thyristors, the means 85 will switch abruptly to a low-resistance, unidirectional current conducting state. Upon operating in this fashion, the overvoltage sensing means 85 immediately conducts a sharply rising pulse of current between terminals 87 and 89, and this current supplies a trigger signal ($i_g$) for the gate electrodes of the main thyristors 71–74. Consequently the main thyristors are triggered by a sharp gate punch before the forward bias voltage can attain the critical breakover level.

The energy storing means 86 of the triggering circuit 70 comprises a capacitor 94 connected in series with an inductor 95 which serves momentarily to impede any current increase therein when the overvoltage sensing means 85 first switches to its conducting state, whereby most of the current initially conducted by the latter means is forced to supply the above-described trigger signal. As an optional feature of the circuit, a resistor 96 can be connected in shunt with the capacitor 94 and inductor 95 to reduce the amplitude of this trigger signal if desired. Although the inductor 95 is shown with an air core, it could have a magnetizable or saturable core if desired.

Once at least one of the main thyristors is turned on, current is diverted from the parallel overvoltage sensing means 85 and flows with rapidly increasing magnitude through that main thyristor. The resulting high rate of rise of anode current can be safely tolerated by the main thyristor whose anode voltage at the time of triggering has a relatively low magnitude due to the prior switching of the overvoltage sensing means 85. The overvoltage sensing means itself can tolerate a relatively high *di/dt* because of its relatively short conducting interval.

The overvoltage triggering circuit as thus far described is the claimed subject matter of the above-cited parent application. In its preferred form, the overvoltage sensing means 85 is seen to comprise a series combination of unidirectional conducting devices 97 and 98. All of these devices are poled to conduct current in the same direction as the parallel main thyristors 71–74. The devices 97 (two are shown in FIG. 1, although more or less can be used in practice) are PNPN semiconductor switching elements. The latter elements can comprise either a stack of individual semiconductor wafers inside a common housing or a plurality of separate and discrete auxiliary thyristors which are serially interconnected in polarity agreement with one another, as shown. Preferably the device 98 is a simple diode (see below), and an inductor 99 is connected in series therewith.

Each of the auxiliary thyristors 97 is an overvoltage triggered controlled switching device having lower voltage and current ratings and smaller size than any one of the main thyristors 71–74. Its characteristic breakover voltage value is a predetermined fraction of the total voltage that will exist across the sensing means 85 when the forward anode voltage on the main thyristors attains the aforesaid threshold magnitude, and the predetermined fractions of all of the devices 97 are respectively selected so that their sum is equal to that total. In the illustrated embodiment of our present invention, these devices will each have the optimized characteristics described below in connection with FIGS. 3 and 4, and they are triggered or turned on in a voltage breakover mode when the cumulative forward voltage that is applied across their interconnected main electrodes approaches a magnitude such as, for example, 2,100 volts. In this example, the peak forward blocking voltage normally applied to the main thyristors 71–74 is less than 2,000 volts, and hence each of the auxiliary thyristors 97 normally remains in its high-resistance, nonconductive state. But as soon as the forward bias voltage on the main thyristors attains the aforesaid threshold magnitude (e.g., 2,100 volts), each of the auxiliary thyristors is operative to switch abruptly to a low-resistance, current-conducting state.

The above-described arrangement offers a number of practical advantages. The auxiliary thyristors 97 individually can be relatively small and inexpensive. The internal capacitance of such a device is relatively small, thereby avoiding a possible problem of premature, weak triggering of the main thyristors due to capacitor charging current between terminals 87 and 97 as the anode voltage approaches its threshold level. The *dv/dt* capability of such devices is desirably high, particularly at low temperatures. These thyristors are individually categorized as low voltage devices, and they can safely turn on in a voltage breakover mode with relatively high *di/dt*.

With one or more diodes 98 connected in series with the auxiliary thyristors 97, the reverse blocking voltage rating of the overvoltage sensing means 85 exceed that of the parallel main thyristors 71–74. The added diodes can have low average forward current ratings, e.g., 3 amperes.

Figures 2, 3, 4, 4A, 4B:
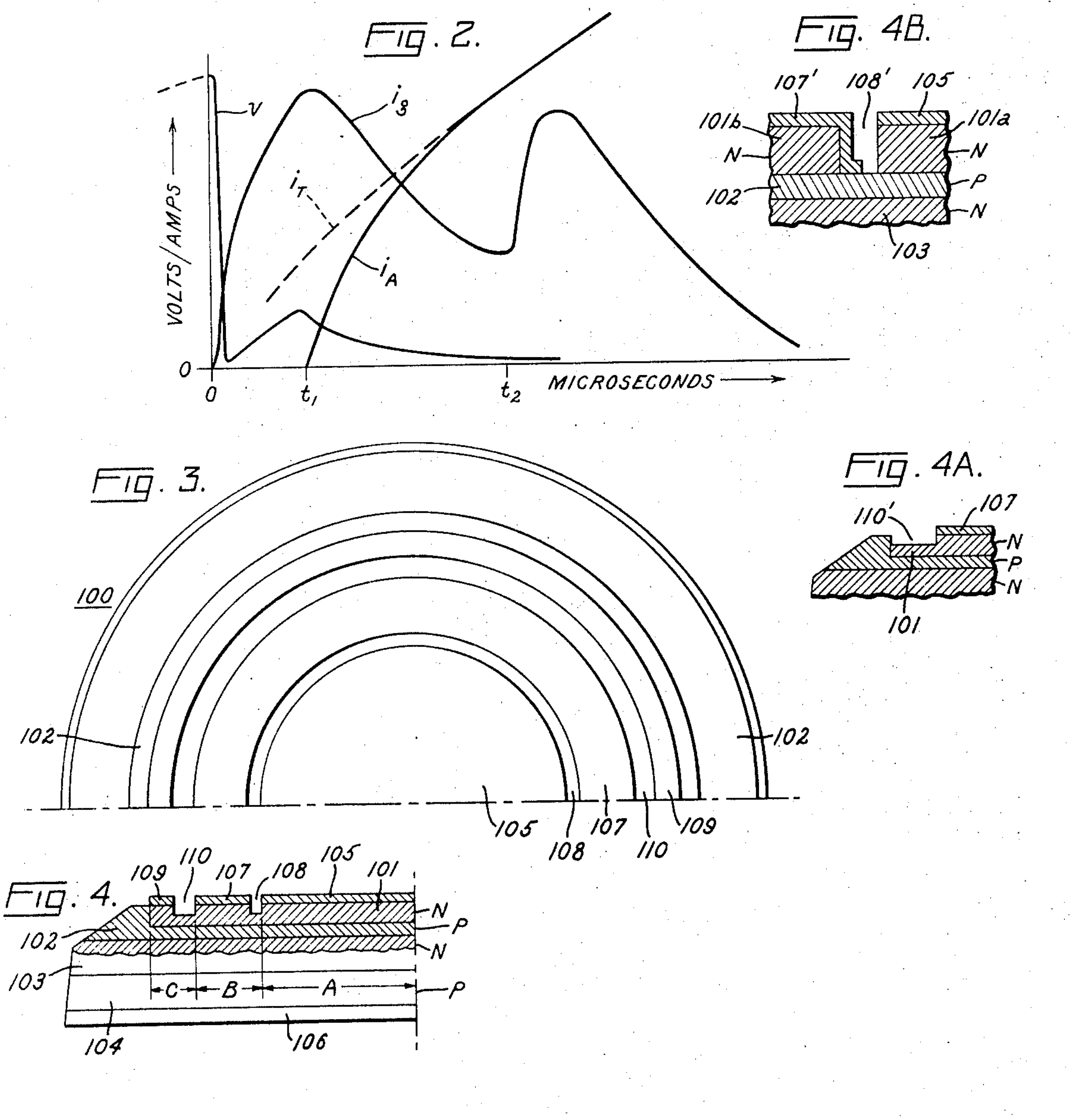
FIG. 2 is a time chart of certain voltage and currents existing in the circuit of FIG. 1 during operation thereof.
FIG. 3 is a partial plan view of a preferred embodiment of our overvoltage triggered semiconductor element.
FIG. 4 is an elevational view, partly in section, of the element shown in FIG. 3.
FIGS. 4*a* and 4*b* are partial elevational views of two modified forms of the FIG. 4 element.

FIG. 2 illustrates the operation of the overvoltage triggering scheme previously described. It is assumed that prior to zero time in FIG. 2 all of the main thyristors 71–74 and auxiliary thryistors 97 in FIG. 1 are off, and the anode voltage *v* across the main thyristors is rising toward an excessively high level. At zero time, the voltage *v* just attains the forward overvoltage magnitude that causes an avalanche breakdown of the auxiliary thyristors. (In practice the threshold magnitude of *v* tends to increase with the rate of rise of the voltage surge, but the parameters of our triggering circuit 70 are so selective that for any *dv/dt* within given limits the level at which triggering actually takes place will fall in a range whose minimum is higher than the normally applied peak forward blocking voltage and whose maximum is lower than the level of forward bias voltage that will cause voltage breakover of the main thyristors.) When triggered in this mode, the auxiliary thyristors 97 abruptly switch to low-resistance states in which they can no longer support the applied voltage, and within a fraction of a microsecond the voltage $v$ collapses to a relatively low value as shown. Current now increases rapidly through the auxiliary thyristors. Since any current increase in the energy storing branch 86 of the circuit 70 is momentarily impeded by the inductor 95, most of the current initially conducted by the auxiliary thyristors is forced to supply gate current $i_g$ from the terminal 89 to the cathode conductor 76 via the conductor 93 and the gating means of the main thyristors 71–74.

From zero time to $t_1$ in FIG. 2, all of the current $i_T$ that flows through the circuits depicted in FIG. 1 will be conducted by the auxiliary thyristors 97. The initial rate of rise of $i_T$ depends on the external system from which this current is derived, and it is additionally limited by the inductor 99 in the triggering circuit 70. For this purpose the inductor 99 may have an inductance in the range of 5 to 40 microhenrys; alternatively it could be omitted altogether if desired. It will be recalled that the individual auxiliary thyristors are not high voltage devices and they can safely tolerate relatively high *di/dt* when turned on in their voltage breakover mode. In addition, as will presently appear, they are soon relieved of their conducting duty and therefore can operate at ambient temperature which further improves their *di/dt* capabilities.

At the juncture 92 of the auxiliary thyristors 97 and the energy storing means 86, the total current $i_T$ splits between the latter means and the gating circuits of the main thyristors. The gate current $i_g$ rises steeply from zero as shown. (It should be noted here that in FIG. 2 the current scale has been expanded for $i_g$ compared to the scale for $i_T$.) At the same time, the capacitor 94 in the energy storing means 86 is being charged by the current which traverses the same. This raises the potential of juncture 92 with respect to the cathode conductor 76, and consequently an increasing forward bias voltage $v$ is imposed on the main thyristors 71–74. The current in the energy storing means 86 is oscillatory, and the parameters of the capacitor 94 and the series inductor 95 which comprise this branch of the triggering circuit 70 are selected so that a half-period of their natural oscillation is in the range of approximately 2 to 8 microseconds. By way of example, a capacitor of 0.1 microfarads and an inductor of 25 microhenrys could be used.

After the main thyristors 71–74 have been supplied with gate current for a short interval which is typically of the order of 2 microseconds (known as the delay time), at least a first one of these devices will turn on, and anode current $i_A$ commences. At this moment, marked $t_1$ in FIG. 2, the gate current $i_g$ has risen to a substantial magnitude (e.g., 15 amperes). If less gate current were desired, a resistor 96 could be connected across the energy storing means 86, as is indicated by broken lines in FIG. 1. As will be observed in FIG. 2, the forward bias voltage $v$ on the main thyristors at the time $t_1$ is still low and rising. Because of the sharp gate punch supplied by our overvoltage triggering circuit, the reduced anode voltage, and the positive *dv/dt*, the first-on main thyristor can safely tolerate the high *di/dt* that results when the through current $i_T$ then flowing in the circuit 70 transfers to the preferred path which that thyristor provides.

The initially steep rise of anode current $i_A$ is clearly shown in FIG. 2. The gate current $i_g$ begins decaying, and the current in the energy storing means 86 will oscillate to zero and reverse. The latter branch of the triggering circuit 70 will now serve as a source or generator of the gate current $i_g$, thereby sustaining a trigger signal of sufficient magnitude and duration to ensure successful turn-on of all of the main thyristors 71–74 in the event that some of them did not start conducting at time $t_1$. This source also reverse biases the auxiliary thyristors 97 which are soon turned off thereby, an event indicated at time $t_2$ in FIG. 2. When reverse recovery current ceases in the auxiliary thyristors, $i_g$ abruptly increases as shown. Thereafter all of the remaining discharge current from the capacitor 94 in the energy storing means 86 will flow through the gate-cathode circuits of the main thyristors. Gate current oscillations are damped by the resistance (e.g., 30 ohms) of the resistor 91.

During the above-described operation, the triggering circuit 70 in effect supplies two consecutive gate pulses to the paralleled main thyristors 71–74. The first wave of gate current rises sharply, and it quickly triggers at least one of the main thyristors. This is followed by another strong wave which enhances the turn-on action of the slowest thyristor in the parallel array. Both turn-on actions occur after the forward bias voltage across the main thyristors has collapsed to a relatively low, safe level. Thus the main thyristors are protected by the auxiliary thyristors from the shock of turning on with high anode voltage. The auxiliary thyristors in turn are protected by the main thyristors from overheating; at least one of the latter will turn on with such a short delay time that it quickly relieves the auxiliary thyristors of load current duty.

By employing the illustrated overvoltage triggering scheme and its attendant advantages in a solid-state valve having a given high voltage rating, fewer levels of series-connected main thyristors are needed, and certain prior art auxiliary components can be reduced in size or eliminated altogether.

A valve equipped with this overvoltage protective circuit can safely turn on in the manner hereinbefore described on a 60-hertz repetitive basis if desired. This offers the possiblity of eliminating at least some of the external gate drive circuits usually associated with the respective matrices of the valve. In certain applications (e.g., inverters), it may be advantageous to use the scheme for normally controlling the valve, in which event the trigger signals could be supplied to the gates of the auxiliary thyristors 97 instead of directly to the gates of the main thyristors 71–74.

For nearly ideal performance, we contemplate using for the unidirectional conducting devices 97 special overvoltage triggered switching elements whose $V_{BO}$ characteristics are optimized for this application. Such a device has been shown in FIGS. 3 and 4, and it is the claimed subject matter of the present continuation application.

FIG. 3 is a plan view of one-half of a symmetrical disc-like PNPN semiconductor element 100, and FIG. 4 is a partial sectional view (not to scale) of the left half of the element shown in FIG. 3. Only the essential parts of the illustrated embodiment of the element 100 are described below; a person skilled in the art will recognize that this element can be made by a variety of well-known methods and that it can be encapsulated in a variety of known structures to form a complete device. If more information is needed, it can be obtained from the above-mentioned DeCecco et al patent which is incorporated herein by reference.

Like the subject matter of DeCecco et al, the special element 100 shown in FIGS. 3 and 4 comprises a body of semiconductor material (e.g., silicon) having four layers or zones, 101, 102, 103, and 104 arranged in succession, with contiguous layers being of different conductivity types. Thus the end layer or emitter 101 of the semiconductor body is of N-type conductivity, the intermediate layer or base 102 that is contiguous with emitter 101 is of P-type conductivity, the next intermediate layer 103 comprises N-type conductivity, and the other end layer 104 is of P-type conductivity. The interface boundaries between the respective layers form rectifying junctions. A metallic contact 106 is disposed on and joined to the P-type end layer 104 of the element in a manner forming a low-resistance ohmic junction therewith, and this contact comprises the anode of the element 100. A thin metallic contact 105 is connected in a similar manner to a central region A of the opposite N-type end layer 101 of the element, and this contact comprises the cathode. As thus constructed, the element 100 is a thin, circular wafer which is intended to be disposed between a pair of spaced-apart main current-carrying electrodes in a sealed housing. The complete device will have appropriate means for connecting the exposed face of the cathode 105 to a cooperating surface of one of these main electrodes and for connecting the anode 106 to the other main electrode.

Outside the central or main region A of the N-type end layer 101 of the element 100 there are two laterally adjacent, concentric auxiliary regions B and C. Both of these auxiliary regions are free of cathode connections. The first auxiliary region B is adjacent to the lateral border of the main region A, and it has connected thereto an annular island or ring 107 of electroconductive material (e.g., gold) which is spaced apart from the cathode 105 by a channel 108. The outboard auxiliary region C circumscribes B and preferably has connected thereto an annular island or ring 109 of electroconductive material which is spaced apart from the ring 107 by a channel 110.

The auxiliary regions B and C of the end layer 101 are characterized by relatively high lateral resistances, with the lateral resistance of the outboard region C being appreciably higher than that of region B. This can be conveniently accomplished by controlling the dimensions of the N-type end layer 101 under the respective channels 108 and 110. Exemplary dimensions will be suggested hereinafter.

The elemnt 100 is so constructed and arranged that when turning on in its forward voltage breakover mode, breakover begins somewhere near the periphery of the wafer. As used herein, the term "peripheral" refers to the areas of the element 100 that are outside the compass of the cathode 105. Preferably a peripheral location of the breakover action is assured by appropriately controlling the angle of the surface bevel which is provided around the external edge of the center rectifying junction of the wafer in a known manner.

If and when the forward bias voltage applied to the anode of a nonconducting element 100 increases to a predetermined critical value, the element will breakover. This happens because leakage current flowing over the surface of the wafer across the external edge of its center junction and through the PN junction between the contiguous layers 101 and 102 increases at some point to a sufficiently high density to trigger a small peripheral area of the wafer. Now this area will provide a path for main current to flow from the anode 106 to the cathode 105. The interlayer path that initially conducts main current includes the auxiliary region B which is located in the end layer 101 between the first peripheral area to conduct and the cathode 105. The auxiliary region B is so constructed and arranged that at least a portion of the initial main current is forced to traverse the rectifying junction that is formed between the adjoining P-layer 102 and the main region A of the N-layer 101. This current is encouraged by the ring 107 to spread out around the perimeter of the main region. At the same time a potential difference is developed across the channel 108. Where it crosses the last-mentioned junction, the main current acts as a high-energy, peremptory trigger signal for a broad area of the wafer subtending substantially the whole perimeter of the cathode 105, thereby turning on the element 100 with the double-triggering action more fully explained in DeCecco et al. Consequently the initial small-area, high-voltage breakover action is converted inside the element 100 to a large-area, lower voltage gate triggering action which materially improves the turn-on *di/dt* capability of the element.

In accordance with the present invention, we have added the auxiliary region C to the prior device to reduce the possibility of improper operation due to a possible effect we call "underpass." The auxiliary region C is so constructed and arranged that the aforementioned leakage current at breakover (also known as "avalanche current") usually flows under region C and first triggers a portion of the auxiliary region B that subtends the ring 107, whereby the two-step triggering process previously described is sure to take place. Without the extra auxiliary region C, there is a risk of passing under the auxiliary region B and initially triggering only a small area of the main region A, in which event the second, amplified step of the desired turn-on process would be undesirably omitted. In our improved device, double triggering and its attendant advantages are ensured. Even if a certain part of the initial leakage current flows directly to the main region A, the auxiliary region B is always the first to be triggered because its current density will be higher than at A. (Actually there is a possibility that even before B turns on, the leakage current may trigger the outboard auxiliary region C of the element 100, in which event the turn on process can be characterized as "triple triggering" [C-B-A] which is harmless.)

The foregoing is achieved by optimizing the auxiliary region B while making the auxiliary region C susceptible to the underpass effect. By way of example, in a high-voltage broad-area wafer (e.g., 33 mm. diameter) the lateral resistance of the auxiliary region B can be of the order of 1.0 ohm (measured between the cathode 105 and the ring 107), and that of the auxiliary region C can be much greater, for example 50 ohms (measured between the rings 107 and 109). In the illustrated embodiment of our invention, this result has been obtained by controlling the dimensions of the channels 108 and 110 which preferably are formed by known etching techniques. More specifically, the width (radial dimension) of the channel 108 was made less than 1 mm., the width of the ring 107 was greater than 2.5 mm., the width of the channel 110 was greater than 1 mm., and the width of the ring 109 was less than 1.5 mm. In this manner we practically assure that enough leakage current will always prefer to cross the PN junction between the P-layer 102 and the auxiliary region B of the emitter to cause double triggering, a result that is substantially more difficult to obtain with certainty in an element not having the extra auxiliary region C due to the unpredictable distribution of leakage current in peripheral areas of its layer 102 just prior to breakover.

In a PNPN element of given overall size, the extra auxiliary region C is added at the cost of reducing the diameter and hence the active area of the cathode 105. This consequently reduces the main current carrying rating of the element. However, this is no handicap in the overvoltage sensing and switching circuit 85 where, as previously noted, the continuous current duty is very small. In fact the devices 97 in this circuit could comprise a plurality of small PNPN elements 100 in series, each element having a normal current rating as low as 1 amp RMS. The latter arrangement offers the advantages of less internal capacitance, easier manufacturing (e.g., more uniform characteristics and higher yields), and greater flexibility in matching whatever predetermined overvoltage magnitude may be specified.

In a modified form of the element 100, the overlying ring 109 is omitted from the auxiliary region C. This is shown in FIG. 4A which is a partial sectional view of the element which is otherwise similar to that shown in FIG. 4. An annular channel 110′ extends across the full width of the reduced-depth perimeter of the N-type end layer 101. Thus the channel 110′ defines the auxiliary region C in the FIG. 4A version of the element, and this region provides the underpass effect previously referred to.

Another modification of the element is depicted in FIG. 4B which is an enlarged partial sectional view of a modified auxiliary region B. In this case the electroconductive ring 107′ is spaced from the cathode 105 by an annular channel of gap 108′ which extends all the way to the intermediate P-layer 102, thereby dividing the N-type end layer into two portions 101*a* and 101*b*. Portion 101*a* is the main region A of the end layer, and the laterally displaced portion 101*b* is the auxiliary region B of the smae layer. In the fashion of a pilot gate, the electroconductive ring 107′ is brought into direct contact with a portion of the P-layer 102 exposed between 101*a* and 101*b*. The operation of this modification of our invention is essentially the same as that previously described in connection with FIGS. 3 and 4. In a known manner, the ring 107′ and the cathode 105 can be interdigitated if desired. This is also true of the other embodiments of our invention, and we do not intend the words "annular" and "ring" as used herein to be limited to circular configurations.

It is important that the element 100 have good *dv/dt* characteristics, and toward this end those skilled in the art will recognize that it should be made by the known alloyed-diffused process or, if all diffused, it should be provided with a shorted emitter.

While various alternative forms of our invention have been hereinbefore described by way of illustration, other modifications will probably occur to those skilled in the art. We therefore intend, by the concluding claims, to cover all such changes and modifications as fall within the true spirit and scope of the invention.

What we claim as new and desire to secure by Letters Patent of the United States is:

1. An overvoltage triggered PNPN semiconductor element comprising:

a. a semiconductor body having four layers arranged in succession with contiguous layers being of different conductivity types, whereby rectifying junctions are formed between contiguous layers of the body;

b. a main current-carrying contact;

c. means for connecting said contact to a predetermined end layer of said body;

d. said predetermined end layer comprising a central main region joined to said contact, a first auxiliary region disposed adjacent to the lateral border of said main region, and a second auxiliary region disposed outboard with respect to said first auxiliary region, all of said regions being contiguous with the intermediate layer of said body that adjoins said predetermined end layer;

e. a ring of electroconductive material spaced apart from said contact and connected to said first auxiliary region;

f. said second auxiliary region being characterized by a lateral resistance appreciably higher than the resistance between said ring and said contact; and g. said semiconductor body being so constructed and arranged that, when connected in a circuit which is subjected to an overvoltage condition, leakage current triggers a peripheral area thereof.

2. The element of claim 1 in which said auxiliary regions are so constructed and arranged that, upon triggering of the element in response to said overvoltage condition, the path that initially conducts main current will include said first auxiliary region, and at least a portion of the initial main current will act as a peremptory trigger signal for a broad area of said body subtending said contact.

3. The element of claim 1 in which an annular island of electroconductive material is connected to the perimeter of said second auxiliary region, said island being spaced apart from said ring and being concentric therewith.

4. The element of claim 1 in which said first auxiliary region is separated from said main region by a gap in said predetermined end layer.

5. The element of claim 4 in which a portion of said intermediate layer of said body is exposed between said first auxiliary region and said main region and said ring is connected thereto.

6. An improved PNPN semiconductor element comprising a plurality of layers of semiconductor material arranged in succession between first and second metal contacts, with contiguous layers being of different conductivity types so that rectifying junctions are formed therebetween, a first one of the opposite end layers of semiconductor material including a central main region joined to said first contact and an annular auxiliary region disposed laterally adjacent thereto, said auxiliary region being located outside said main region and having superimposed thereon a ring of electroconductive material spaced apart from said first contact, said element being so constructed and arranged that, upon applying across said first and second contacts a forward bias voltage of sufficiently high value to cause a voltage breakover of said element, breakover action begins in a peripheral area thereof, wherein the improvement comprises:

an additional annular auxiliary region of said first end layer circumscribing the first-mentioned auxiliary region and having a lateral resistance appreciably higher than the resistance between said ring and said first contact.

7. The element of claim 6 wherein said additional auxiliary region has sufficient lateral resistance to provide an underpass effect.

* * * * *